(12) United States Patent
Ohno et al.

(10) Patent No.: US 7,923,742 B2
(45) Date of Patent: Apr. 12, 2011

(54) METHOD FOR PRODUCTION OF A NITRIDE SEMICONDUCTOR LAMINATED STRUCTURE AND AN OPTICAL SEMICONDUCTOR DEVICE

(75) Inventors: Akihito Ohno, Tokyo (JP); Masayoshi Takemi, Tokyo (JP); Nobuyuki Tomita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 120 days.

(21) Appl. No.: 12/404,647

(22) Filed: Mar. 16, 2009

(65) Prior Publication Data
US 2009/0236589 A1 Sep. 24, 2009

(30) Foreign Application Priority Data
Mar. 18, 2008 (JP) ................. 2008-069744

(51) Int. Cl.
*H01L 33/00* (2010.01)
(52) U.S. Cl. ........................ 257/98; 257/99
(58) Field of Classification Search ........ 438/99
See application file for complete search history.

(56) References Cited

U.S. PATENT DOCUMENTS

| | | | |
|---|---|---|---|
| 5,650,198 A * | 7/1997 | Denbaars et al. | 427/255.394 |
| 5,740,192 A | 4/1998 | Hatano et al. | |
| 5,902,393 A | 5/1999 | Nido et al. | |
| 6,043,140 A | 3/2000 | Kawai et al. | |
| 6,284,042 B1 | 9/2001 | Sasaoka | |
| 6,508,879 B1 | 1/2003 | Hashimoto | |
| 6,617,235 B2 | 9/2003 | Iyechika et al. | |
| 7,063,997 B2 * | 6/2006 | Cho et al. | 438/39 |
| 7,601,553 B2 * | 10/2009 | Yoo et al. | 438/47 |
| 7,763,486 B2 | 7/2010 | Ohno et al. | |
| 7,825,012 B2 * | 11/2010 | Ohno et al. | 438/479 |
| 2002/0026892 A1 | 3/2002 | Aoyagi et al. | |
| 2006/0138446 A1 | 6/2006 | Yoo et al. | |
| 2006/0157714 A1 * | 7/2006 | Yoo et al. | 257/79 |
| 2007/0025231 A1 | 2/2007 | Ochiai et al. | |

(Continued)

FOREIGN PATENT DOCUMENTS

JP 6-232451 A 8/1994

(Continued)

OTHER PUBLICATIONS

Hsu et al.; "Low temperature metalorganic chemical vapor deposition of gallium nitride using dimethylhydrazine as nitrogen source", *Thin Solid Films*, 419 (2002) 33-39.

(Continued)

*Primary Examiner* — N Drew Richards
*Assistant Examiner* — Robert Carpenter
(74) *Attorney, Agent, or Firm* — Leydig, Voit & Mayer, Ltd.

(57) ABSTRACT

A nitride semiconductor laminated structure comprises: a substrate; a first p-type nitride semiconductor layer formed using an organometallic compound as a Group III element source material, a p-type impurity source material, and ammonia as a Group V element source material, with the hydrogen concentration in the first p-type nitride semiconductor layer being $1\times10^{19}$ cm$^{-3}$ or less; and a second p-type nitride semiconductor layer on the first p-type nitride semiconductor layer formed using an organometallic compound as a Group III element source material, a p-type impurity source material, and ammonia and a hydrazine derivative as Group V element source materials, with the carbon concentration in the second p-type nitride semiconductor layer being $1\times10^{18}$ cm$^{-3}$ or less.

24 Claims, 5 Drawing Sheets

U.S. PATENT DOCUMENTS

2010/0075483 A1    3/2010  Ohno et al.

FOREIGN PATENT DOCUMENTS

| | | |
|---|---|---|
| JP | 8-56015 A | 2/1996 |
| JP | 8-316151 A | 11/1996 |
| JP | 8-325094 A | 12/1996 |
| JP | 9-148626 A | 6/1997 |
| JP | 9-199758 A | 7/1997 |
| JP | 9-251957 A | 9/1997 |
| JP | 10-4211 A | 1/1998 |
| JP | 10-12554 A | 1/1998 |
| JP | 10-17400 A | 1/1998 |
| JP | 19-12555 A | 1/1998 |
| JP | 11-307458 A | 11/1999 |
| JP | 11-329981 A | 11/1999 |
| JP | 11-354456 A | 12/1999 |
| JP | 2000-164513 A | 6/2000 |
| JP | 2001-15437 A | 1/2001 |
| JP | 2001-144325 A | 5/2001 |
| JP | 2001-320084 A | 11/2001 |
| JP | 2002-75879 A | 3/2002 |
| JP | 2002-231643 A | 8/2002 |
| JP | 2002-319743 A | 10/2002 |
| JP | 2003-178987 A | 6/2003 |
| JP | 2004-47867 A | 2/2004 |
| JP | 2005-026602 A | 1/2005 |
| JP | 2007-131518 A | 5/2007 |
| JP | 2007-189028 A | 7/2007 |
| JP | 2008-078186 A | 4/2008 |

OTHER PUBLICATIONS

Park et al.; "As-grown p-type GaN growth by dimethylhydrazine nitrogen precursor", *J. of Crystal Growth*, 272 (2004) pp. 426-431.

* cited by examiner

METHOD FOR PRODUCTION OF A NITRIDE SEMICONDUCTOR LAMINATED STRUCTURE AND AN OPTICAL SEMICONDUCTOR DEVICE

BACKGROUND OF THE INVENTION

1. Field of the Invention

The present invention relates to a nitride semiconductor laminated structure and an optical semiconductor device, and methods for producing the same, in particular, a nitride semiconductor laminated structure having a p-type nitride semiconductor layer satisfactory in crystallinity and sufficiently low in electric resistivity, an optical semiconductor device, and methods for producing the same.

2. Background Art

In these years, for the purpose of high densification of optical disks, research and development of semiconductor lasers capable of emitting light from the blue region to the ultraviolet region are being actively conducted. Such blue-violet laser diodes (hereinafter, laser diode is abbreviated as LD) each have a nitride semiconductor laminated structure made of a nitride such as GaN, GaPN, GaNAs, InGaN, AlGaN or AlGaInN. Optical semiconductor devices having an AlGaInN-based laminated structure have already been put into practical use.

As a method for producing a nitride semiconductor laminated structure, there has been proposed a method in which a p-type GaN layer is formed by using only ammonia as a Group V material, and thereafter a p-type GaN layer is formed by using only trimethylhydrazine as a group V material (see, for example, Japanese Patent Laid-Open No. 2003-178987).

SUMMARY OF THE INVENTION

When ammonia ($NH_3$) is used as a Group V material in the formation of a p-type GaN layer, the H radical produced from ammonia is incorporated into the p-type GaN layer. Consequently, there is caused a problem that the H passivation involving the reaction between the H radical and the p-type impurity occurs and hence the activation ratio of the p-type impurity is decreased to increase the electric resistivity of the p-type GaN layer. In this context, by conducting a heat treatment following the crystal growth to activate the p-type impurity, the electric resistivity of the p-type GaN layer can be decreased. However, such a heat treatment detaches nitrogen (N) from the surface of the p-type GaN layer to deteriorate the crystal as the case may be.

[Chemical formula 1]

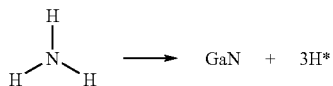

On the other hand, when dimethylhydrazine (UDMHy) is used as a Group V material in the formation of a p-type GaN layer, the $CH_3$ radical is produced from dimethylhydrazine concurrently with the production of the H radical. The produced $CH_3$ radical reacts with the H radical to be discharged as $CH_4$, and hence the incorporation of the H radical in the crystal can be prevented.

[Chemical formula 2]

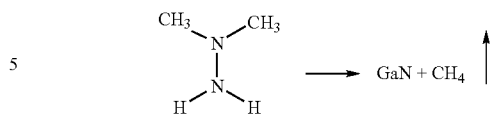

However, unless the $CH_3$ radical isolated from trimethylgallium (TMG) used as a Group III material is also discharged as $CH_4$, the $CH_3$ radical is incorporated into the crystal to increase the carbon concentration. Additionally, carbon compensates the acceptor, and hence the electric resistivity is increased. However, when only dimethylhydrazine is used as a Group V material, the H radical needed for producing $CH_4$ from the $CH_3$ radical becomes deficient. Consequently, there is caused a problem that the electric resistivity of the p-type GaN layer becomes high.

[Chemical formula 3]

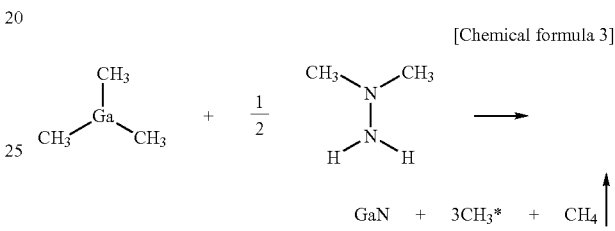

The present invention was achieved for the purpose of solving the above-described problems, and takes as its object the attainment of a nitride semiconductor laminated structure having a p-type nitride semiconductor layer satisfactory in crystallinity and sufficiently low in electric resistance, and the development of an optical semiconductor device and methods for producing the same.

According to one aspect of the present invention, a nitride semiconductor laminated structure comprises: a substrate; a first p-type nitride semiconductor layer formed by using an organometallic compound as a Group III material, a p-type impurity material and ammonia as a Group V material, the hydrogen concentration in the first p-type nitride semiconductor layer being $1 \times 10^{19}$ $cm^{-3}$ or less; and a second p-type nitride semiconductor layer formed on the first p-type nitride semiconductor layer by using an organometallic compound as a Group III material, a p-type impurity material, and ammonia and a hydrazine derivative each as a Group V material, the carbon concentration in the second p-type nitride semiconductor layer being $1 \times 10^{18}$ $cm^{-3}$ or less.

According to the present invention, there can be obtained a nitride semiconductor laminated structure having a p-type nitride semiconductor layer satisfactory in crystallinity and sufficiently low in electric resistivity.

Other and further objects, features and advantages of the invention will appear more fully from the following description.

DETAILED DESCRIPTION OF THE PREFERRED EMBODIMENTS

First Embodiment

Figure 1:
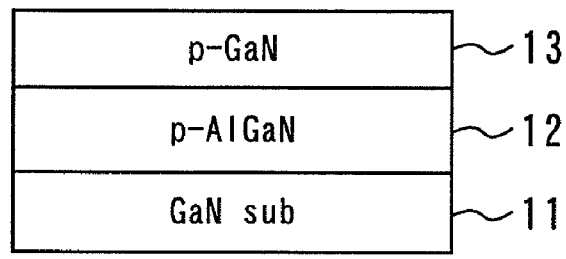
FIG. 1 is a sectional view illustrating the nitride semiconductor laminated structure according to a first embodiment of the present invention.

FIG. 1 is a sectional view illustrating the nitride semiconductor laminated structure according to a first embodiment of the present invention. This nitride semiconductor laminated structure is a laminated structure of a blue-violet LD. However, this laminated structure is not limited to a laminated structure of an optical semiconductor device such as a blue-violet LD, but may be a laminated structure of a common semiconductor device such as a transistor.

On the principal surface of a GaN substrate 11 (substrate), namely, the (0001) plane, a p-type $Al_{0.07}Ga_{0.93}N$ layer 12 (a first p-type nitride semiconductor layer) of 1 μm in layer thickness is formed. On this p-type $Al_{0.07}Ga_{0.93}N$ layer 12, a p-type GaN layer 13 (a second p-type nitride semiconductor layer) of 0.02 μm in layer thickness is formed. In this case, the p-type $Al_{0.07}Ga_{0.93}N$ layer 12 is formed by using an organometallic compound as a Group III material, a p-type impurity material, and ammonia as a Group V material. The p-type GaN layer 13 is formed by using an organometallic compound as a Group III material, a p-type impurity material, and ammonia and a hydrazine derivative each as a Group V material. Additionally, the hydrogen concentration in the p-type $Al_{0.07}Ga_{0.93}N$ layer 12 is $1 \times 10^{19}$ cm$^{-3}$ or less, and the carbon concentration in the p-type GaN layer 13 is $1 \times 10^{18}$ cm$^{-3}$ or less.

When the hydrogen concentration in the p-type $Al_{0.07}Ga_{0.93}N$ layer 12 is high, the H passivation involving the reaction between the H radical and the p-type impurity occurs, and the activation ratio of the p-type impurity is decreased. Additionally, when a heat treatment is conducted to activate the p-type impurity, nitrogen (N) is detached from the surface of the p-type semiconductor layer to deteriorate the crystal. In contrast to this case, the p-type $Al_{0.07}Ga_{0.93}N$ layer 12 has a hydrogen concentration of $1 \times 10^{19}$ cm$^{-3}$ or less, and hence is sufficiently low in electric resistivity, needs no heat treatment and is satisfactory in crystallinity.

Figure 2:
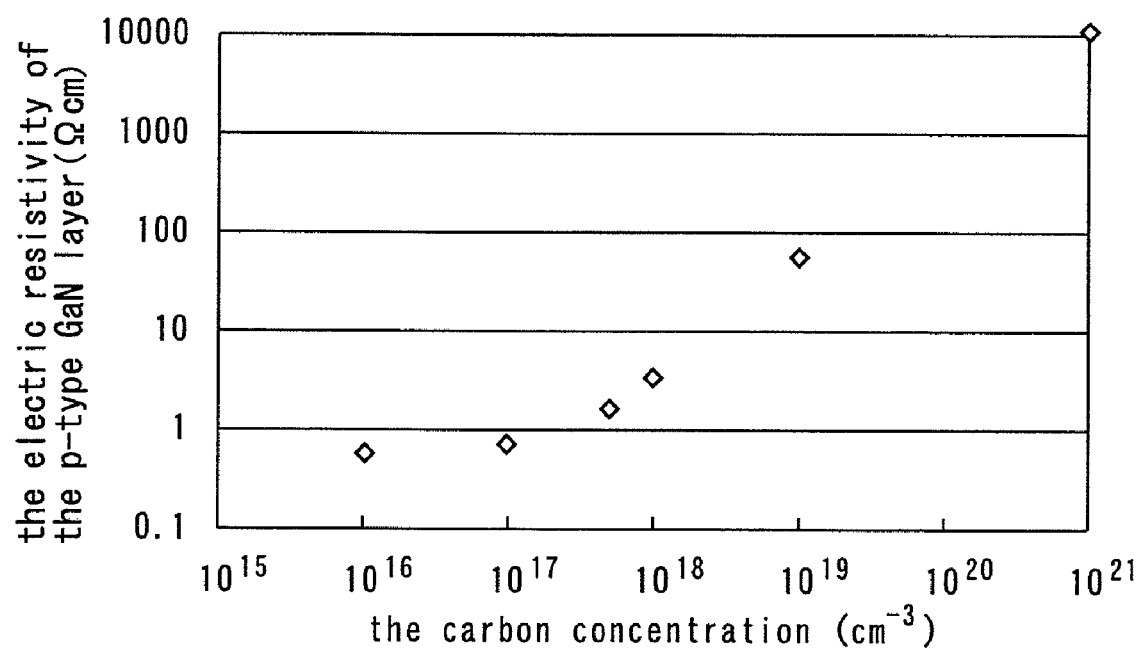
FIG. 2 is a graph showing the carbon concentration dependence of the electric resistivity of the p-type GaN layer.

FIG. 2 is a graph showing the carbon concentration dependence of the electric resistivity of the p-type GaN layer. The detection limit of carbon is $1 \times 10^{16}$ cm$^{-3}$. As can be seen from the results shown in this figure, the carbon concentration of the p-type GaN layer 13 is $1 \times 10^{18}$ cm$^{-3}$ or less, and the electric resistivity is sufficiently low to such a degree that the p-type GaN layer can be used as a device. Accordingly, the nitride semiconductor laminated structure according to the present embodiment has a p-type nitride semiconductor layer satisfactory in crystallinity and sufficiently low in electric resistivity.

Next, description is made on the method for producing the nitride semiconductor laminated structure according to the present embodiment. As a crystal growth method, a MOCVD method is used. As Group III materials, trimethylgallium (TMG) and trimethylaluminum (TMA), which are organometallic compounds, are used. As a p-type impurity material, cyclopentadienylmagnesium ($CP_2Mg$) is used. As Group V materials, ammonia ($NH_3$) and 1,2-dimethylhydrazine (hydrazine derivative) are used. As the carrier gases for these material gases, hydrogen ($H_2$) gas and nitrogen ($N_2$) gas are used.

First, the GaN substrate 11 is placed in a reaction furnace of a MOCVD apparatus, and the temperature of the GaN substrate 11 is increased up to 1000° C. while a flow rate of $4.5 \times 10^{-1}$ mol/min of ammonia and a flow rate of 20 l/min of nitrogen gas are being fed.

Next, in addition to the nitrogen gas and ammonia, a flow rate of $2.4 \times 10^{-4}$ mol/min of TMG, a flow rate of $1.4 \times 10^{-5}$ mol/min of TMA and a flow rate of $3.0 \times 10^{-7}$ mol/min of $CP_2Mg$ are fed. In this way, on the principal surface of the GaN substrate 11, the p-type $Al_{0.07}Ga_{0.93}N$ layer 12 is formed.

Next, the feeding of TMA is terminated, and together with a carrier gas, a flow rate of $1.2 \times 10^{-4}$ mol/min of TMG, a flow rate of $9.0 \times 10^{-7}$ mol/min of $CP_2Mg$, and a flow rate of $4.5 \times 10^{-2}$ mol/min of ammonia as a Group V material and additionally a flow rate of $5.6 \times 10^{-4}$ mol/min of 1,2-dimethylhydrazine as a Group V material are fed. In this way, on the p-type $Al_{0.07}Ga_{0.93}N$ layer 12, the p-type GaN layer 13 is formed. In this case, the growth time is 5 minutes.

Next, the feeding of TMG and $CP_2Mg$ is terminated, and cooling is conducted down to about 300° C. while the Group V materials are being fed. Thereafter, the feeding of the Group V materials is also terminated, and the temperature of the GaN substrate 11 is decreased by cooling down to room temperature. It is to be noted that when the feeding of TMG and $CP_2Mg$ is terminated, the feeding of ammonia may also be terminated and cooling may be conducted down to about 300° C. while only 1,2-dimethylhydrazine is being fed. Because 1,2-dimethylhydrazine is decomposed at a temperature lower than the temperature at which ammonia is decomposed, the redetachment of nitrogen from the crystal face is reduced, and the morphology of the surface is improved. By the above-described steps, the nitride semiconductor laminated structure according to the present embodiment is produced.

In this connection, a first feature of the present embodiment is the formation of the p-type GaN layer 13 by using ammonia and a hydrazine derivative each as a Group V material. From the hydrazine derivative, $CH_3$ radical is produced concurrently with the H radical. The $CH_3$ radical reacts with the H radical to be discharged as $CH_4$, and hence the H radical is prevented from being incorporated into the crystal.

The laminated structure of the present embodiment was subjected to a Hall measurement based on the Van der Pauw method, and consequently the carrier (positive hole) concentration at room temperature was found to be $3 \times 10^{17}$ cm$^{-3}$ and the electric resistivity was found to be 1.6 Ωcm. On the other hand, the similar laminated structure obtained by using only ammonia as a Group V material at the time of the growth of the p-type GaN layer was subjected to the Hall measurement; however, the p-type GaN layer as grown was too high in electric resistivity and hence the Hall measurement was unsuccessful. Accordingly, the p-type GaN layer was subjected to a heat treatment at about 900° C., then subjected to the Hall measurement, and the positive hole concentration was found to be $3.5 \times 10^{17}$ cm$^{-3}$ and the electric resistivity was found to be 1.5 Ωcm. Thus, the present embodiment was found to be able to realize a comparable electric resistivity without applying any heat treatment.

The CH$_3$ radical isolated from TMG as a Group III material is required to be discharged as CH$_4$. However, when only dimethylhydrazine is used as a Group V material, the H radical required for formation of CH$_4$ from the CH$_3$ radical is deficient. Accordingly, in the present embodiment, a predetermined amount of ammonia is added to supply the H radical in an amount required for the production of CH$_4$. Thus, the carbon concentration in the p-type GaN layer 13 can be made to be $1\times10^{18}$ cm$^{-3}$ or less. It is to be noted that when the H radical is too large in amount, the H passivation occurs and hence the feeding amount of NH$_3$ is required to be controlled to a minimum.

A second feature of the present embodiment is the formation of the p-type Al$_{0.07}$Ga$_{0.93}$N layer 12 by using only ammonia as a Group V material. In other words, carbon tends to be incorporated into the Al-containing layer, and hence a hydrazine derivative that contains carbon is not used at the time of the growth of the p-type Al$_{0.07}$Ga$_{0.93}$N layer 12. In this regard, however, when only a p-type AlGaN layer was allowed to grow on a substrate and subjected to a SIMS analysis, the hydrogen concentration in the p-type AlGaN layer was found to be $2.0\times10^{19}$ cm$^{-3}$ which was comparable to the Mg concentration. In contrast to this, in the present embodiment, the hydrogen concentration in the p-type Al$_{0.07}$Ga$_{0.93}$N layer 12 is $1\times10^{19}$ cm$^{-3}$ or less. Accordingly, there can be formed a p-type nitride semiconductor layer sufficiently low in electric resistivity. Such successful suppression of the hydrogen concentration is ascribable to the fact that during the growth of the p-type GaN layer 13, the incorporation of hydrogen into the p-type Al$_{0.07}$Ga$_{0.93}$N layer 12 can be prevented.

As described above, according to the method of the present embodiment, a p-type nitride semiconductor layer sufficiently low in electric resistivity can be formed. Additionally, according to the method of the present embodiment, no heat treatment is required to be conducted after the crystal growth for the purpose of activation of the p-type impurity and hence the crystallinity is satisfactory.

Figure 3:
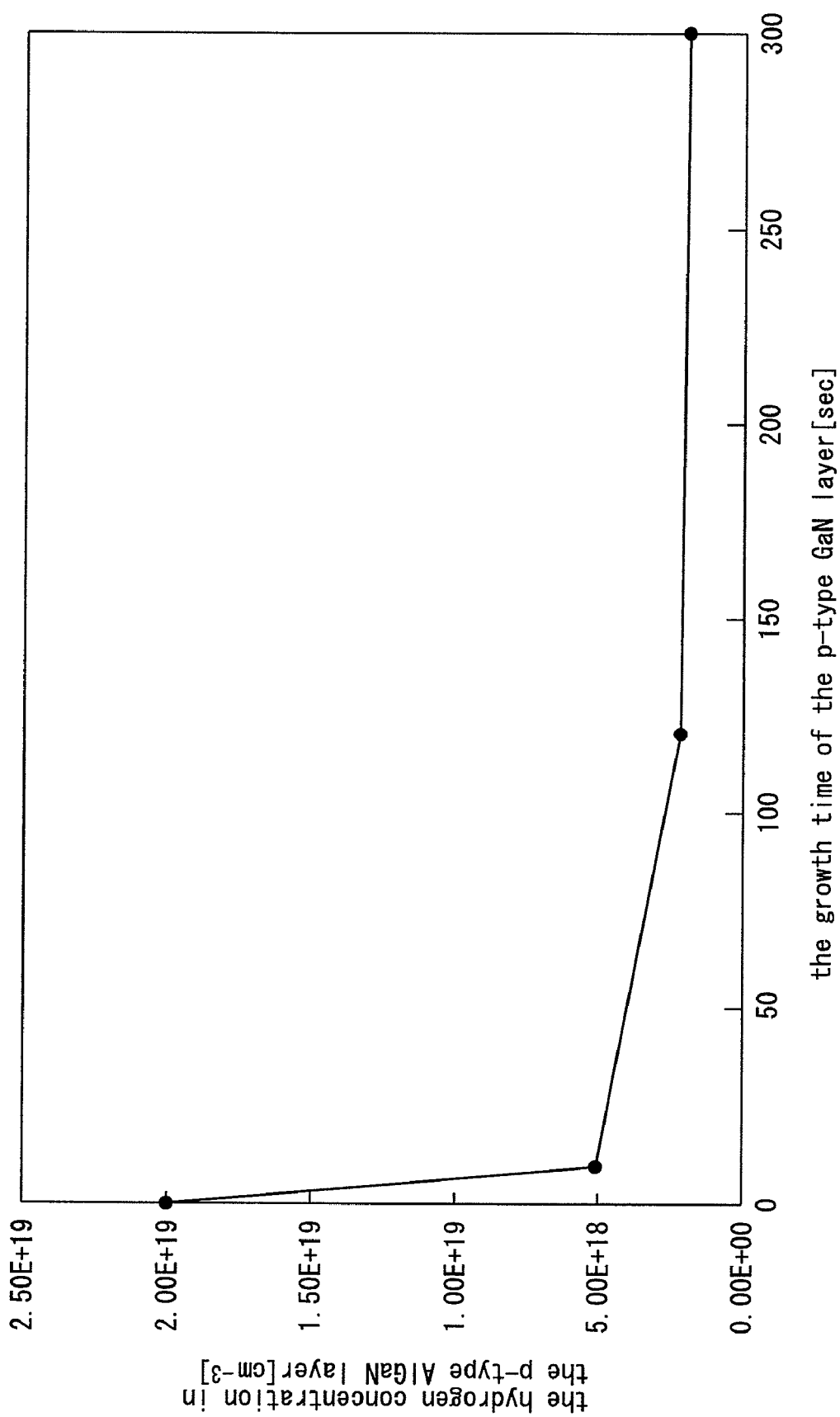
FIG. 3 shows the results, measured by the SIMS analysis, of the hydrogen concentration in the p-type AlGaN layer when the growth time of the p-type GaN layer was varied.

FIG. 3 shows the results, measured by the SIMS analysis, of the hydrogen concentration in the p-type AlGaN layer when the growth time of the p-type GaN layer was varied. In this case, the Mg concentration in the p-type AlGaN layer 12 was $2\times10^{19}$ cm$^{-3}$. Accordingly, when the growth time of the p-type GaN layer 13 is 0 second, that is, no growth is conducted, the hydrogen concentration is $2.0\times10^{19}$ cm$^{-3}$, which is comparable to the Mg concentration, and the H passivation occurs, and hence the activation ratio of the p-type impurity is unsatisfactory and no p-type nitride semiconductor layer low in electric resistance is obtained; on the contrary, when the growth time is 10 seconds or more, the hydrogen concentration is $5\times10^{18}$ cm$^{-3}$ or less. When the hydrogen concentration is $1\times10^{19}$ cm$^{-3}$ or less, the ratio of the hydrogen concentration to the Mg concentration in the p-type AlGaN layer is ½ or less, the positive hole concentration at room temperature of $1\times10^{17}$ cm$^{-3}$ or more is obtained, and thus, a p-type nitride semiconductor layer sufficiently low in electric resistivity can be formed. Further, it has been found that when the growth time is 120 seconds or more, the hydrogen concentration is $2\times10^{18}$ cm$^3$ or less (hydrogen concentration/Mg concentration=1/10 or less). Therefore, the growth time of the p-type GaN layer 13 is set preferably at 10 seconds or more and more preferably at 120 seconds or more.

Additionally, when the p-type GaN layer 13 is formed, used as the carrier gas is a mixed gas of hydrogen gas and nitrogen gas in which the mixing proportion by volume of the hydrogen gas is represented by x ($0 \leqq x \leqq 1$) and the mixing proportion by volume of the nitrogen gas is represented by 1−x. In other words, the carrier gas at the time of forming the p-type layer may be solely nitrogen gas, a mixed gas of nitrogen gas and hydrogen gas, or solely hydrogen gas. In this connection, when the temperature of the GaN substrate 11 is around 1000° C., the hydrogen gas is not dissociated but is present as it is in the state of hydrogen molecules, and hence is not incorporated into the crystal. Accordingly, the H radical to be incorporated into the crystal probably originates mainly from the H radical derived from the decomposition of NH$_3$, and hence even when the carrier gas is solely hydrogen gas, a p-type GaN layer 13 low in electric resistivity can be formed.

For example, when a mixed gas of hydrogen gas and nitrogen gas at a ratio of 1:1 is used, a feed flow rate of 10 l/min of nitrogen gas and a feed flow rate of 10 l/min hydrogen gas are mixed together. In such a case where the carrier gas was the mixed gas, the surface morphology of the p-type GaN layer was found satisfactory, as compared to the case where the carrier gas was solely nitrogen gas. As a result of the Hall measurement conducted on the basis of the Van der Pauw method, the positive hole concentration at room temperature was found to be $5\times10^{17}$ cm$^{-3}$ and the electric resistivity was found to be 0.9 Ωcm. Additionally, a heat treatment conducted at 700° C. in a nitrogen gas atmosphere was found to increase the positive hole concentration to $7\times10^{17}$ cm$^{-3}$ and to decrease the electric resistivity to 0.6 Ωcm. The fact that such application of the additional heat treatment decreased the electric resistivity as compared to the case where solely nitrogen gas was used is conceivably ascribable to the fact that the use of the mixed gas improved the smoothness of the surface and hence the crystallinity was improved.

Figure 4:
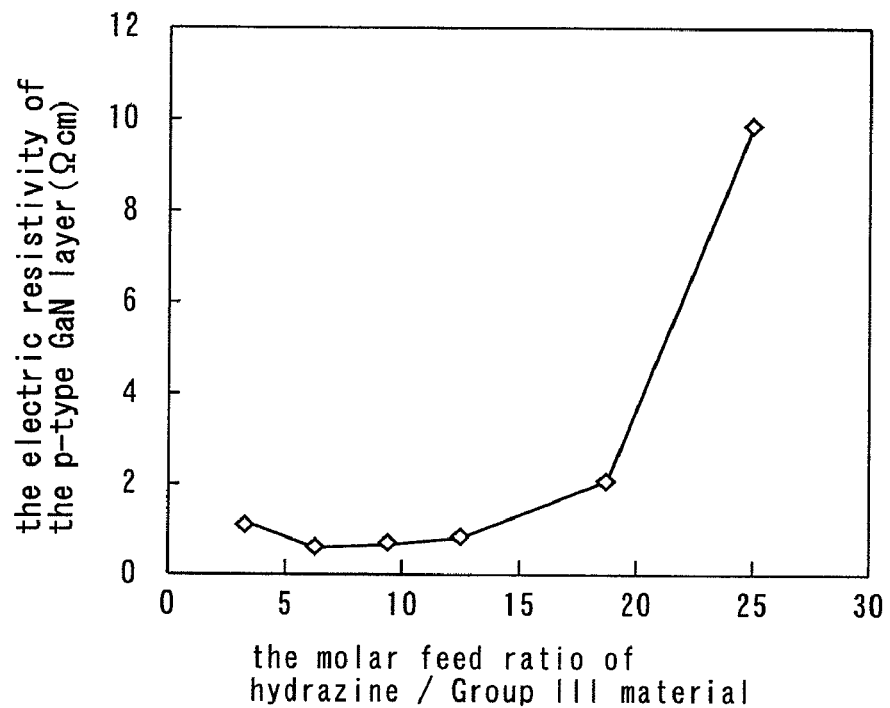
FIG. 4 is a graph showing the molar feed ratio of hydrazine/Group III material, dependence of the electric resistivity of the p-type GaN layer.

FIG. 4 is a graph showing the molar feed ratio of hydrazine/Group III material, dependence of the electric resistivity of the p-type GaN layer. The molar feed ratio of hydrazine/Group III material, is the ratio of the molar feed flow rate of hydrazine to the molar feed flow rate of the Group III material. The temperature of the GaN substrate 11 was set at 1000° C., and the molar feed ratio of NH$_3$/hydrazine was set at 120 and the mixed gas of nitrogen gas and hydrogen gas at a ratio of 1:1 was used as a carrier gas. Consequently, it was found that the electric resistivity was steeply increased between the molar feed ratio of hydrazine/Group III material, values of 20 and 25. This is ascribable to the increase of the concentration of the carbon contained in the crystal. On the other hand, when the molar feed ratio of hydrazine/Group III material, is less than 1, the Group V vacancies are generated in the crystal to cause the deterioration of the crystal. Accordingly, when the p-type GaN layer 13 is formed, the molar feed ratio of the hydrazine derivative to the organometallic compound is preferably set at 1 or more and less than 20, and more preferably 3 or more and 15 or less.

Figure 5:
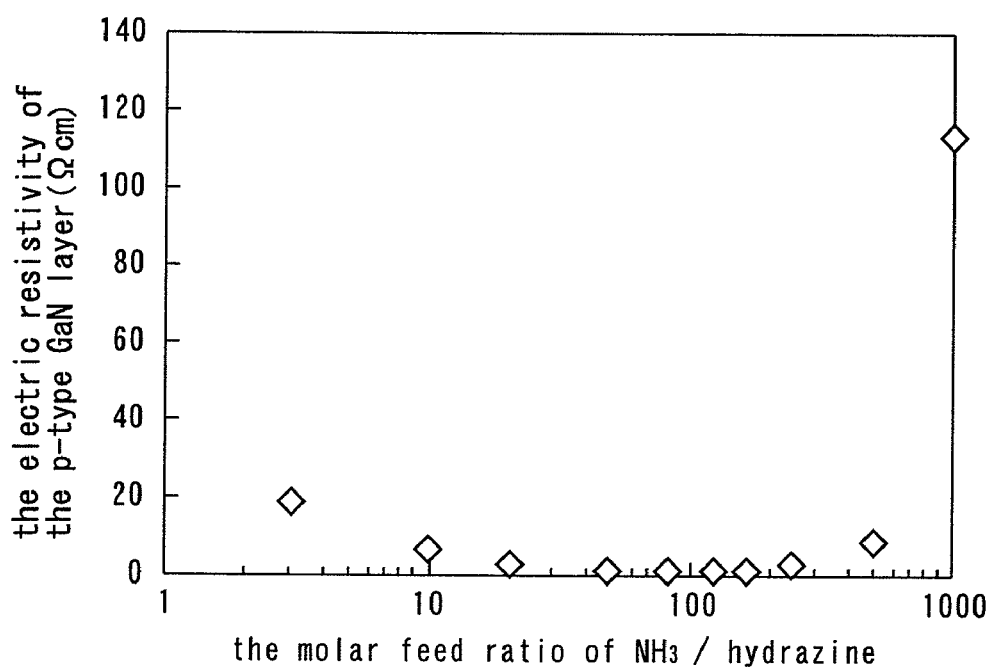
FIG. 5 is a graph showing the molar feed ratio of $NH_3$/hydrazine, dependence of the electric resistivity of the p-type GaN layer.

FIG. 5 is a graph showing the molar feed ratio of NH$_3$/hydrazine, dependence of the electric resistivity of the p-type GaN layer. The molar feed ratio of NH$_3$/hydrazine, is the ratio of the molar feed flow rate of NH$_3$ to the molar feed flow rate of hydrazine. The temperature of the GaN substrate 11 was set at 1000° C., and the molar feed flow rate of hydrazine to the molar feed flow rate of the Group III material was set at 9.4 and the mixed gas of nitrogen gas and hydrogen gas at a ratio of 1:1 was used as a carrier gas. Consequently, it was found that the electric resistivity was increased when the molar feed ratio of NH$_3$/hydrazine, was 10 or less because the supply of the H radical was insufficient and the carbon concentration in the crystal was increased. On the other hand, for the molar feed ratio of NH$_3$/hydrazine, falling between 500 and 1000, the electric resistivity was found to be steeply increased. This is ascribable to the H passivation caused by the incorporation of H into the crystal due to the excessive feeding of NH$_3$.

Accordingly, when the p-type GaN layer 13 is formed, the molar feed ratio of ammonia to the hydrazine derivative is preferably set at 10 or more and less than 1000, and more preferably 20 or more and 500 or less.

Figure 6:
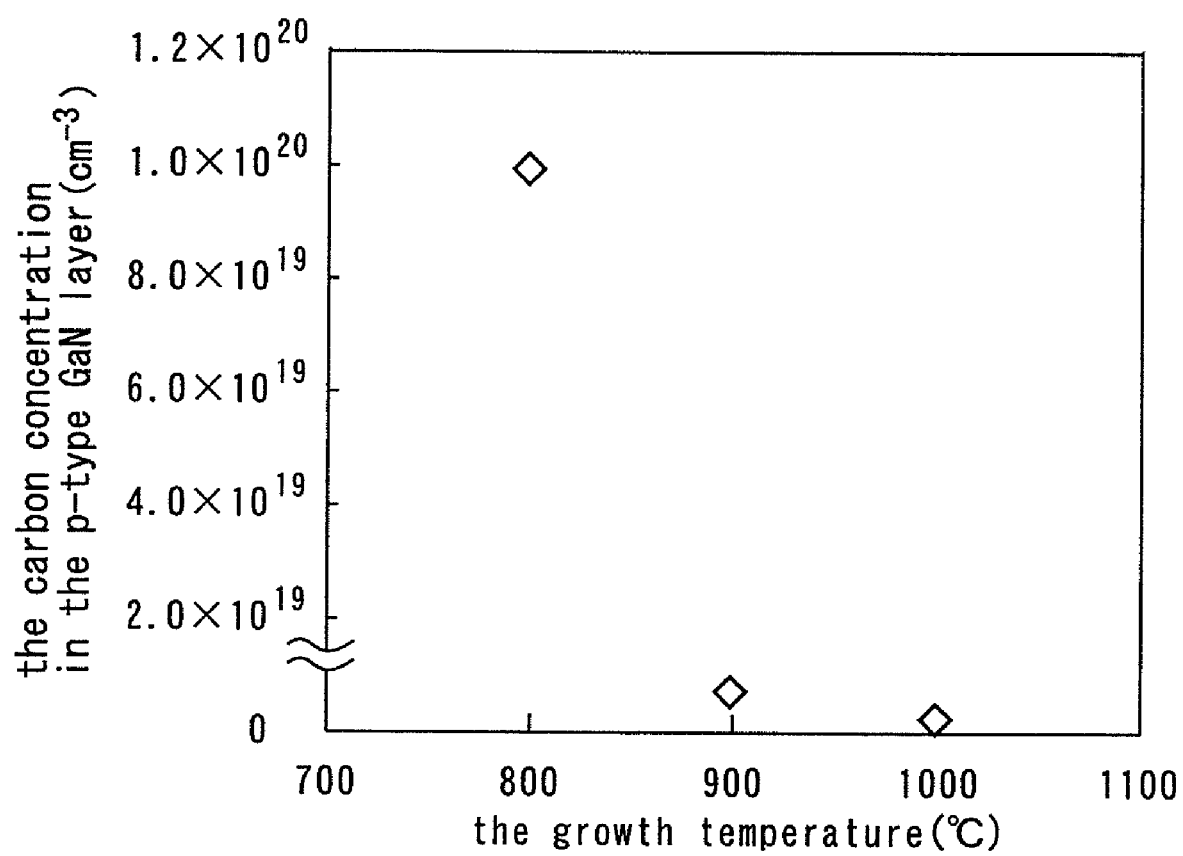
FIG. 6 is a graph showing the growth temperature dependence of the carbon concentration in the p-type GaN layer.

FIG. 6 is a graph showing the growth temperature dependence of the carbon concentration in the p-type GaN layer. The growth temperature is the same as the temperature of the substrate. The molar feed ratio of hydrazine/Group III material was set at 9.4, the molar feed ratio of $NH_3$/hydrazine was set at 120, and the mixed gas of nitrogen gas and hydrogen gas at a ratio of 1:1 was used as a carrier gas. Consequently, the carbon concentration in the crystal was found to be steeply decreased in the temperature range from 800° C. to 900° C. Probably, with the decrease of the growth temperature, the decomposition of $NH_3$ is reduced to prevent the $CH_3$ radical from being discharged in the form of $CH_4$, and the $CH_3$ radical is incorporated into the crystal. On the other hand, the temperatures at which the crystal growth of the p-type GaN is possible fall in the range of lower than 1200° C. Accordingly, when the p-type GaN layer 13 is formed, the temperature of the n-type GaN substrate 21 is preferably set at 800° C. or higher and lower than 1200° C. and more preferably 900° C. or higher and lower than 1200° C.

Second Embodiment

Figure 7:
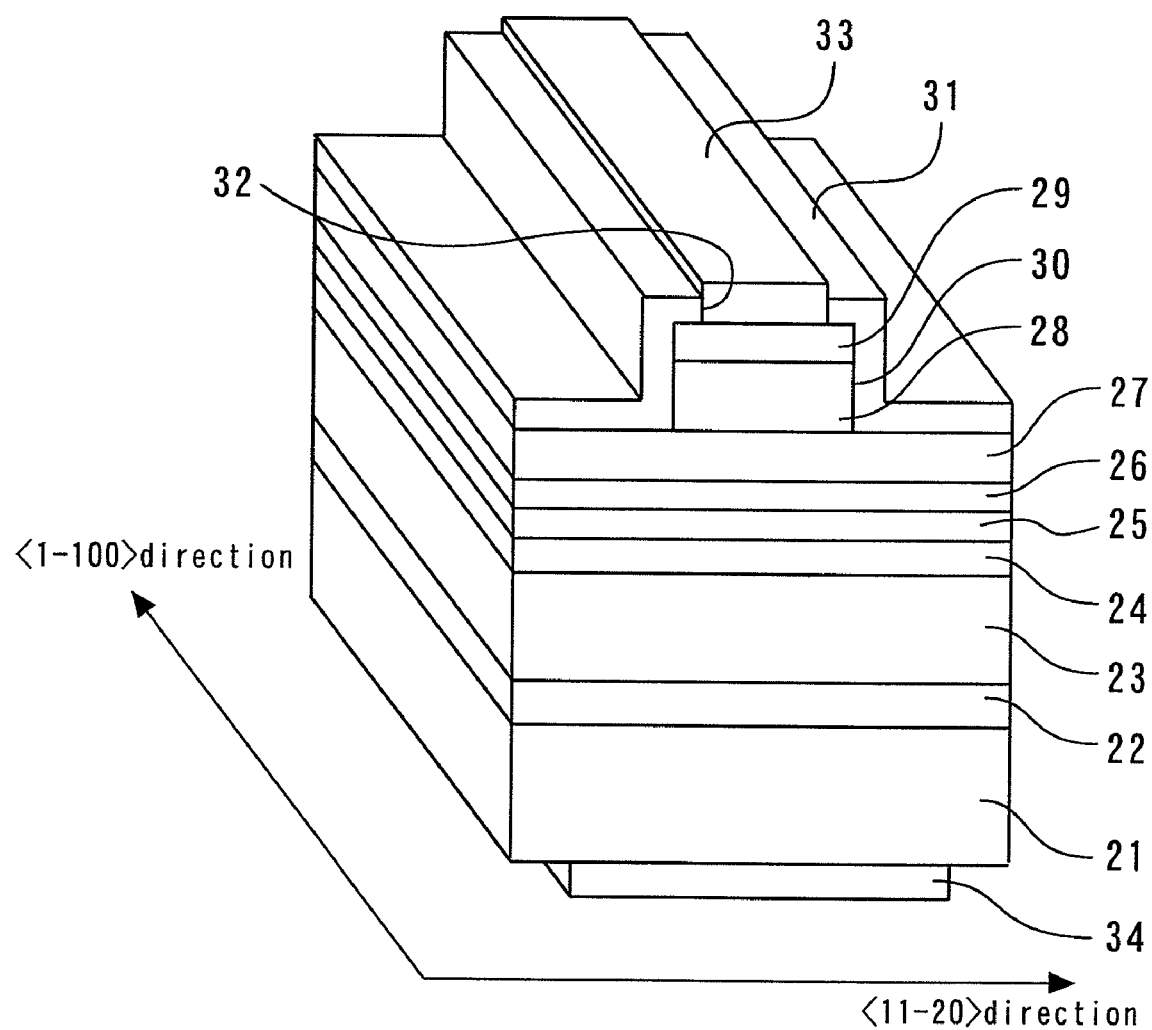
FIG. 7 is an oblique perspective view lustrating an optical semiconductor device according to a second embodiment of the present invention.

FIG. 7 is an oblique perspective view lustrating an optical semiconductor device according to a second embodiment of the present invention. This optical semiconductor device is a ridge waveguide blue-violet LD. However, the optical semiconductor device is not limited to this, but can be applied generally to blue-violet LDs in the same manner.

On the principal surface of the n-type GaN substrate 21 (substrate), namely, the (0001) plane, the following layers are formed in the order specified below: an n-type GaN buffer layer 22 of 1 μm in layer thickness, an n-type $Al_{0.07}Ga_{0.93}N$ clad layer 23 (n-type clad layer) of 1.0 μm in layer thickness, an n-type GaN optical guide layer 24 of 0.1 μm in layer thickness, an active layer 25, a p-type $Al_{0.2}Ga_{0.8}N$ electron barrier layer 26 of 0.02 μm in layer thickness, a p-type GaN optical guide layer 27 of 0.1 μm in layer thickness, a p-type $Al_{0.07}Ga_{0.93}N$ clad layer 28 (p-type clad layer) of 0.4 μm in layer thickness, and a p-type GaN contact layer 29 (p-type contact layer) of 0.1 μm in layer thickness.

The active layer 25 is a multiple quantum well structure in which an $In_{0.12}Ga_{0.88}N$ well layer of 3.5 nm in layer thickness and a GaN barrier layer of 7.0 nm in layer thickness are alternately laminated to form a laminated structure made up of three pairs of these layers. The p-type $Al_{0.07}Ga_{0.93}N$ clad layer 28 and a p-type GaN contact layer 29 form a waveguide ridge 30. The waveguide ridge 30 is formed in the widthwise central portion of the resonator and is located, in an extended manner, between the two cleavage planes that serve as the resonator end faces.

A silicon dioxide film 31 is provided on the side walls of the waveguide ridge 30 and the exposed surface of the p-type GaN optical guide layer 27. On the top surface of the waveguide ridge 30, the opening portion 32 of the silicon dioxide film 31 is located, and from this opening portion 32, the surface of the p-type GaN contact layer 29 is exposed. To the exposed portion of the p-type GaN contact layer 29, a p-side electrode 33 made of a Pt film and an Au film is electrically connected. On the back side of the n-type GaN substrate 21, formed is an n-side electrode 34 prepared by sequentially laminating a Ti film and an Al film by vacuum deposition.

Here, the p-type $Al_{0.07}Ga_{0.93}N$ clad layer 28 is formed by using an organometallic compound as a Group III material, a p-type impurity material and $NH_3$ as a Group V material. The p-type GaN contact layer 29 is formed by using an organometallic compound as a Group III material, a p-type impurity material, and $NH_3$ and a hydrazine derivative each as a Group V material. The hydrogen concentration in the p-type $Al_{0.07}Ga_{0.93}N$ clad layer 28 is $1\times10^{19}$ $cm^{-3}$ or less, and the carbon concentration in the p-type GaN contact layer 29 is $1\times10^{18}$ $cm^{-3}$ or less. Therefore, similarly to the nitride semiconductor laminated structure according to the first embodiment, the optical semiconductor device according to the present embodiment also has a p-type nitride semiconductor layer satisfactory in crystallinity and sufficiently low in electric resistivity.

Next, description is made on the optical semiconductor device according to the present embodiment. As the crystal growth method, the MOCVD method is used. As Group III materials, trimethylgallium (TMG), trimethylaluminum (TMA) and trimethylindium (TMI) that are organometallic compounds are used. As Group V materials, ammonia ($NH_3$) and 1,2-dimethylhydrazine (hydrazine derivative) are used. As an n-type impurity material, monosilane ($SiH_4$) is used, and as a p-type impurity material, cyclopentadienylmagnesium ($CP_2Mg$) is used. As the carrier gas for these material gases, hydrogen gas ($H_2$) and nitrogen gas ($N_2$) are used.

First, the n-type GaN substrate 21 is placed in the reaction furnace of the MOCVD apparatus. Thereafter, while ammonia is being fed, the temperature of the n-type GaN substrate 21 is increased up to 1000° C. Next, the feeding of TMG and monosilane is started to form the n-type GaN buffer layer 22 on the principal surface of the n-type GaN substrate 21. Next, the feeding of TMA is started to form the n-type $Al_{0.07}Ga_{0.93}N$ clad layer 23. Next, the feeding of TMA is terminated, and n-type GaN optical guide layer 24 is formed. Next, the feeding of TMG and monosilane is terminated, and the temperature of the n-type GaN substrate 21 is decreased down to 700° C.

Next, TMG, TMI and ammonia are fed to form the $In_{0.12}Ga_{0.88}N$ well layer. Then, feeding of TMI is terminated, and TMG and ammonia are fed to form the GaN barrier layer. The well layer and the barrier layer are alternately laminated to form three pairs of the well layer and the barrier layer to form the active layer 25 of the multiple quantum well (MQW) structure.

Next, while ammonia is being fed, the temperature of the n-type GaN substrate 21 is again increased up to 1000° C. Then, TMG, TMA and $CP_2Mg$ are fed to form the p-type $Al_{0.2}Ga_{0.8}N$ electron barrier layer 26 on the principal surface of the n-type GaN substrate 21. Then, the feeding of TMA is terminated, and the p-type GaN optical guide layer 27 is formed.

Next, the feeding of TMA is again started, and a flow rate of $2.4\times10^{-4}$ mol/min of TMG, a flow rate of $1.4\times10^{-5}$ mol/min of TMA, a flow rate of $3.0\times10^{-7}$ mol/min of $CP_2Mg$, and ammonia as a Group V material are fed to form the p-type $Al_{0.07}Ga_{0.93}N$ clad layer 28. The carbon concentration of the p-type $Al_{0.07}Ga_{0.93}N$ clad layer 28 is $1\times10^{18}$ $cm^{-3}$ or less.

Next, the feeding of TMA is terminated, and together with the carrier gas, a flow rate of $1.2\times10^{-4}$ mol/min of TMG, a flow rate of $9.0\times10^{-7}$ mol/min of $CP_2Mg$, and a flow rate of $4.5\times10^{-2}$ mol/l of ammonia as a Group V material and additionally a flow rate of $5.6\times10^{-4}$ mol/min of 1,2-dimethylhydrazine as a Group V material are fed to form the p-type GaN contact layer 29.

Next, the feeding of TMG and $CP_2Mg$ is terminated, and while the Group V materials are being fed, cooling is conducted down to about 300° C. It is to be noted that when the feeding of TMG and CP$_2$Mg is terminated, the feeding of ammonia may also be terminated and cooling may be conducted down to about 300° C. while only 1,2-dimethylhydrazine is being fed as a Group V material.

Next, the whole surface of the wafer completed with the crystal growth is coated with a resist and a resist pattern is formed corresponding to the shape of the mesa-shaped portion by means of lithography. By using this resist pattern as the mask, etching is conducted by a reactive ion etching (RIE) method to an extent that the p-type Al$_{0.07}$Ga$_{0.93}$N clad layer 28 is removed or slightly remains. By this etching, the waveguide ridge 30 to be an optical waveguide structure is formed. As the etching gas for RIE, for example, a chlorine-based gas is used.

Next, as the resist pattern is allowed to remain, on the whole surface of the n-type GaN substrate 21, the silicon dioxide film 31 of 0.2 μm in film thickness is formed by means of, for example, a CVD method, a vacuum deposition method or a sputtering method. Subsequently, at the same time of the removal of the resist pattern, the silicon dioxide film 31 present on the waveguide ridge 30 is removed by means of a so-called liftoff method. Thus, the opening portion 32 is formed in the silicon dioxide film 31 on the waveguide ridge 30.

Next, on the whole surface of the n-type GaN substrate 21, a Pt film and an Au film are sequentially formed by means of, for example, a vacuum deposition method, and thereafter, a resist is applied, and the p-side electrode 33 is formed by means of lithography and wet etching or dry etching.

Next, on the whole back side of the n-type GaN substrate 21, a Ti film and an Al film are sequentially formed by means of a vacuum deposition method to form the n-side electrode 34, and an alloy treatment is conducted for the purpose of performing ohmic contact of the n-side electrode 34 to the n-type GaN substrate 21.

Next, the n-type GaN substrate 21 is machined into a bar shape by cleaving or the like to form the two end faces of the resonator. Then, the end faces of the resonator are coated, and thereafter the bar is cleaved into a chip shape to produce the optical semiconductor device according to the present second embodiment.

A feature of the present embodiment is that the p-type GaN contact layer 29 is formed by using ammonia and a hydrazine derivative as Group V materials and the p-type Al$_{0.07}$Ga$_{0.93}$N clad layer 28 is formed by using only ammonia as a Group V material. In this way, similarly to the first embodiment, it is enabled to form a p-type nitride semiconductor layer sufficiently low in electric resistivity. Additionally, no heat treatment to activate the p-type impurity after the crystal growth is required, and hence the crystallinity of the p-type nitride semiconductor layer is satisfactory.

Also, similarly to the first embodiment, when the p-type GaN contact layer 29 is formed, used as the carrier gas is a mixed gas of hydrogen gas and nitrogen gas in which the mixing proportion by volume of the hydrogen gas is represented by x ($0 \leq x \leq 1$) and the mixing proportion by volume of the nitrogen gas is represented by 1−x. In other words, the carrier gas at the time of forming the p-type layer may be solely nitrogen gas, a mixed gas of nitrogen gas and hydrogen gas, or solely hydrogen gas.

Also, similarly to the first embodiment, the growth time of the p-type GaN contact layer 29 is set preferably at 10 seconds or more and more preferably at 120 seconds or more. When the p-type GaN contact layer 29 is formed, the molar feed ratio of the hydrazine derivative to the organometallic compound is set preferably at 1 or more and less than 20 and more preferably at 3 or more and 15 or less. When the p-type GaN contact layer 29 is formed, the molar feed ratio of ammonia to the hydrazine derivative is set preferably at 10 or more and less than 1000 and more preferably at 20 or more and 500 or less. When the p-type GaN contact layer 29 is formed, the temperature of the n-type GaN substrate 21 is set preferably at 800° C. or higher and lower than 1200° C. and more preferably at 900° C or higher and lower than 1200° C.

It is to be noted that in the first and second embodiments, a substrate such as a sapphire, SiC or Si wafer substrate may be used in place of the GaN substrate 11 and the n-type GaN substrate 21. As the crystal growth method, a crystal growth method such as molecular beam epitaxy (MBE) or hydride vapor phase epitaxy (HVPE) may be used in place of metalorganic vapor phase epitaxy. Triethylgallium (TEG) may be used in place of TMG. As the hydrazine derivative, 1,1-dimethylhydrazine may be used in place of 1,2-dimethylhydrazine. As the p-type impurity, Zn may be used in place of Mg.

Additionally, an In$_x$Al$_y$Ga$_{1-x-y}$N layer ($0 \leq x \leq 1$, $0 \leq y \leq 1$) may be used in place of the p-type Al$_{0.07}$Ga$_{0.93}$N layer 12, p-type GaN layer 13, p-type Al$_{0.07}$Ga$_{0.93}$N clad layer 28 or p-type GaN contact layer 29. However, as has been described in the first embodiment, the highest advantageous effect is attained when the under-side p-type nitride semiconductor layer is an AlGaN layer and the upper-side p-type nitride semiconductor layer is a GaN layer.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-069744, filed on Mar. 18, 2008 including specification, claims, drawings and summary, on which the Convention priority of the present application is based, are incorporated herein by reference in its entirety.

What is claimed is:

1. A method for producing a nitride semiconductor laminated structure, comprising:
   forming a p-type AlGaN layer on a substrate using an organometallic compound as a Group III element source material, a p-type impurity source material, and only ammonia as a Group V element source material; and
   forming a p-type GaN layer on the p-type AlGaN layer using an organometallic compound as a Group III element source material, a p-type impurity source material, and ammonia and a hydrazine derivative as Group V element source materials.

2. The method for producing a nitride semiconductor laminated structure according to claim 1, including growing the p-type GaN layer for at least 10 seconds.

3. The method for producing a nitride semiconductor laminated structure according to claim 1, including growing the p-type GaN layer for at least 120 seconds.

4. The method for producing a nitride semiconductor laminated structure according to claim 1, including forming the p-type GaN layer using, as a carrier gas, a mixture of hydrogen and nitrogen in which the volume proportion of the hydrogen is x ($0 \leq x \leq 1$) and the volume proportion of the nitrogen is 1−x.

5. The method for producing a nitride semiconductor laminated structure according to claim 1, including forming the p-type GaN layer using a molar feed ratio of the hydrazine derivative to the organometallic compound in a range from 1 to less than 20.

6. The method for producing a nitride semiconductor laminated structure according to claim 1, including forming the p-type GaN layer using a molar feed ratio of the hydrazine derivative to the organometallic compound in a range from 3 to 15.

7. The method for producing a nitride semiconductor laminated structure according to claim 1, including forming the p-type GaN layer using a molar feed ratio of ammonia to the hydrazine derivative in a range from 10 to less than 1000.

8. The method for producing a nitride semiconductor laminated structure according to claim 1, including forming the p-type GaN layer using a molar feed ratio of ammonia to the hydrazine derivative in a range from 20 to less than 500.

9. The method for producing a nitride semiconductor laminated structure according to claim 1, including forming the p-type GaN layer at a substrate temperature in a range from 800° C. to lower than 1200° C.

10. The method for producing a nitride semiconductor laminated structure according to claim 1, including forming the p-type GaN layer at a substrate temperature in a range from 900° C. to lower than 1200° C.

11. The method for producing a nitride semiconductor laminated structure according to claim 1, including using, as the hydrazine derivative, one of 1,1-dimethylhydrazine and 1,2-dimethylhydrazine.

12. A method for producing an optical semiconductor device, comprising:
    forming an n-type cladding layer on a substrate;
    forming an active layer on the n-type cladding layer;
    forming a p-type AlGaN cladding layer on the active layer using an organometallic compound as a Group III element source material, a p-type impurity source material, and only ammonia as a Group V element source material; and
    forming a p-type GaN contact layer on the p-type AlGaN cladding layer using an organometallic compound as a Group III element source material, a p-type impurity source material, and ammonia and a hydrazine derivative as Group V element source materials.

13. The method for producing an optical semiconductor device according to claim 12, including growing the p-type GaN contact layer for at least 10 seconds.

14. The method for producing an optical semiconductor device according to claim 12, including growing the p-type GaN contact layer for at least 120 seconds.

15. The method for producing an optical semiconductor device according to claim 12, including forming the p-type GaN contact layer using, as a carrier gas, a mixture of hydrogen and nitrogen in which volume proportion of the hydrogen is x ($0 \leqq x \leqq 1$) and the volume proportion of the nitrogen is represented by 1−x.

16. The method for producing an optical semiconductor device according to claim 12, including forming the p-type GaN contact layer using a molar feed ratio of the hydrazine derivative to the organometallic compound in a range from 1 to less than 20.

17. The method for producing an optical semiconductor device according to claim 12, including forming the p-type GaN contact layer using a molar feed ratio of the hydrazine derivative to the organometallic compound in a range from 3 to 15.

18. The method for producing an optical semiconductor device according to claim 12, including forming the p-type GaN contact layer using a molar feed ratio of ammonia to the hydrazine derivative in a range from 10 to less than 1000.

19. The method for producing an optical semiconductor device according to claim 12, including forming the p-type GaN contact layer at a molar feed ratio of ammonia to the hydrazine derivative in a range from 20 to 500.

20. The method for producing an optical semiconductor device according to claim 12, including forming the p-type GaN contact layer at a substrate temperature in a range from 800° C. to lower than 1200° C.

21. The method for producing an optical semiconductor device according to claim 12, including forming the p-type GaN contact layer at a substrate temperature in a range from 900° C. to lower than 1200° C.

22. The method for producing an optical semiconductor device according to claim 12, including using, as the hydrazine derivative, one of 1,1-dimethylhydrazine and 1,2-dimethylhydrazine.

23. The method for producing a nitride laminated structure according to claim 1, wherein
    the p-type AlGaN layer includes hydrogen in a concentration not exceeding $1 \times 10^{19}$ cm$^{-3}$, and
    the p-type GaN layer contains carbon in a concentration not exceeding $1 \times 10^{18}$ cm$^{-3}$.

24. The method for producing an optical semiconductor device according to claim 12, wherein
    the p-type AlGaN cladding layer includes hydrogen in a concentration not exceeding $1 \times 10^{19}$ cm$^{-3}$, and
    the p-type GaN contact layer contains carbon in a concentration not exceeding $1 \times 10^{18}$ cm$^{-3}$.

* * * * *